United States Patent [19]
Fillot et al.

[11] Patent Number: 4,728,388
[45] Date of Patent: Mar. 1, 1988

[54] PROCESS FOR PRODUCING A MONOCRYSTAL OF A COMPOUND BY CRYSTALLIZING A POLYCRYSTAL OF SAID COMPOUND BY TRANSFERRING A SOLVENT ZONE

[75] Inventors: Alain Fillot, St. Ismier; Jean Gallet, St. Laurent du Pout; Sylvain Paltrier, Meylan; Bernard Schaub, Grenoble, all of France

[73] Assignee: Commissariat a l'Energie Atomique, Paris, France

[21] Appl. No.: 759,758

[22] Filed: Jul. 29, 1985

[30] Foreign Application Priority Data

Aug. 17, 1983 [FR] France .................. 83 13388

[51] Int. Cl.[4] .............. C30B 13/02; C30B 29/48; C30B 9/06
[52] U.S. Cl. .................. 156/604; 156/616 R; 156/624; 156/DIG. 72; 156/DIG. 82
[58] Field of Search .............. 156/600, 616 R, 604, 156/DIG. 72, DIG. 82, 624; 423/508

[56] References Cited
U.S. PATENT DOCUMENTS 4,465,527 8/1984 Nishizawa .................. 156/616 R
4,551,196 11/1985 Capper et al. .................. 156/616 R
4,564,415 1/1986 Fillot et al. .................. 156/604

FOREIGN PATENT DOCUMENTS 0060744 2/1982 European Pat. Off. .
2502190 9/1982 France .
2536767 8/1984 France .

Primary Examiner—Gary P. Straub
Attorney, Agent, or Firm—Oblon, Fisher, Spivak, McClelland & Maier

[57] ABSTRACT

The invention relates to a process for the preparation of a binary initial solvent zone for the crystallization in monocrystal form of a ternary or quaternary compound of given composition and containing Cd and Hg. It consists of choosing on the phase equilibrium diagram of the compound, the Cd and Hg concentration and the temperature which crystallization is to take place. When raised to this temperature, the initial solvent zone is able to dissolve the compound until a solvent zone in thermodynamic equilibrium therewith is obtained and on the basis of which it is possible to bring about crystallization. The composition of the initial solvent zone and the temperature at which it is to be prepared are determined on the diagram.

6 Claims, 3 Drawing Figures

PROCESS FOR PRODUCING A MONOCRYSTAL OF A COMPOUND BY CRYSTALLIZING A POLYCRYSTAL OF SAID COMPOUND BY TRANSFERRING A SOLVENT ZONE

BACKGROUND OF THE INVENTION

The present invention relates to a process for the preparation of a solvent zone for use in the production of ternary or quaternary semiconductor compounds by the so-called "solvent zone transfer method".

This process is suitable for producing ternary compounds of formula $Cd_xHg_{0.5-x}Te_{0.5}$ and quaternary compounds of formula $Cd_xHg_{0.5-x}Te_ySe_{0.5-y}$, whereby in said formulas $0<x<0.5$ and $0<y<0.5$. These compounds have a forbidden band width varying continuously with the atomic fractions x and y, which makes it possible to produce infrared photo detectors operating at any wavelength exceeding 0.8 μm.

From the general standpoint, the solvent zone transfer method makes it possible to produce monocrystalline semiconductor compounds at a temperature below their melting point, which makes it possible to obtain very pure compounds, which have a better crystalline quality than those obtained using other monocrystal production processes. In the particular case of semiconductor compounds of formula $Cd_xHg_{0.5-x}Te_{0.5}$ or formula $Cd_xHg_{0.5-x}Te_ySe_{0.5-y}$, said method makes it possible to overcome the difficulties associated with the presence of mercury vapor having a high pressure at the melting point of said compounds.

The basic principle of the so-called solvent zone transfer method applied to semiconductor compounds of type II–VI has been clearly described in the article by G. A. WOLFF et al, which appeared in the Transactions of the Metallurgical Society of AIME, vol. 242, March 1968, pp 436–441.

With reference to FIG. 1, said method consists of introducing a polycrystalline semiconductor compound ingot, called the source ingot 2 into a cylindrical silica boat 4 in the verticle position, where it is traversed by a molten solvent zone 6, positioned beforehand at the end of the boat. A furnace 8 makes it possible to heat the boat and its content in the portion facing the furnace. The longitudinal displacement of the boat, in accordance with arrow 10, enables the solvent zone 6 to dissolve the ingot 2 and to crystallize behind it a monocrystalline ingot 12. The dissolving interface carries reference 13 and the recrystallization interface reference 14.

The dissolving of the source ingot 2 by the solvent zone 6 leads to a modification of the initial composition of the solvent zone. The growth process of ingot 12 is established when the solvent zone 6, which is liquid, is in thermodynamic equilibrium with the source ingot 2 and the monocrystallized ingot 12.

In the aforementioned article, the method is applied to the growth of monocrystals of ternary semiconductor compounds of type II–VI. The initial solvent zone, ie the solvent zone existing before any transfer of said zone along the semiconductor ingot is made from pure tellurium.

In the same way, in the article by R. TRIBOULET, which appeared in the Revue de Physique Appliquée, Vol. 12, pp 123–128, February 1977 a description is given of the preparation of crystals containing Cd, Hg, Te from juxtaposed CdTe and HgTe bars constituting the source or supply materials of an initial tellurium solvent zone.

The choice of an initial solvent zone made from pure tellurium imposes the temperature of the final solvent zone from which it is possible to obtain the crystallization in the form of a monocrystal of the supply compound of said zone, in view of the fact that the liquid solvent zone and the solid compound must be in thermodynamic equilibrium.

In order to make it possible to choose the temperature at which the monocrystal could form, it has been proposed to use as the initial solvent zone, a solvent zone having the final composition of said zone, ie when the latter is in thermodynamic equilibrium with the supply compound and the crystallized compound.

French Pat. No. 8 105 387 of 18.3.1981 describes such a solvent zone. This patent, which refers to obtaining semiconductor compounds containing Cd, Hg and Te, uses as the initial solvent zone a mixture of CdTe, HgTe and Te, which is rich in tellurium, said solvent zone being supplied by CdTe and HgTe bars. The preparation of a tellurium-rich, ternary, initial liquid zone containing Cd, Hg and Te in thermodynamic equilibrium with the corresponding solid compound, involves preparing the solvent zone at the highest possible thermodynamic equilibrium temperature and guarding against mercury leaks linked with the high vapour pressure of said constituent.

Moreover, in the case where the cadmium is introduced in the form of a CdTe compound, the preparation of the solvent zone takes several hours, bearing in mind the slow dissolving kinetics of said compound in the HgTe+Te liquid.

Thus, in the various prior art processes, significant problems occur in connection with the preparation in the form of monocrystals of ternary or quaternary compounds, particularly of formulas $Cd_xHg_{0.5-x}Te_y$ and $Cd_xHg_{0.5-x}Te_ySe_{0.5-y}$, when using the solvent zone transfer method.

Thus, to obtain monocrystals of pure semiconductor compounds with a high crystalline quality, it is necessary to produce the initial solvent zone at as moderate a temperature as possible, said zone at the best being able to reach the thermodynamic equilibrium with the solid taking the place of the supply compound of said zone.

SUMMARY OF THE INVENTION

The problem of the present invention is to provide a process for the preparation of an initial solvent zone making it possible to obviate the aforementioned prior art disadvantages, whilst being just as simple to perform as the prior art processes.

More specifically the present invention relates to a process for the preparation of a binary initial solvent zone permitting crystallization in the form of a monocrystal of a polycrystalline ternary or quaternary compound having a given composition and containing cadmium and mercury, wherein, on the phase equilibrium diagram of the compound, a choice is made of the cadmium and mercury concentration of said compound, as well as the termperature at which said crystallization is to take place, the initial solvent zone raised to said temperature being able to dissolve the ternary or quaternary compound until a respectively ternary or quaternary zone is obtained in thermodynamic equilibrium with said compound, from which said crystallization has taken place and wherein, on said diagram, on the basis of said concentration and said temperature, the composition of the initial binary solvent zone and the temperature at which said initial binary solvent zone is to be prepared are determined.

This process makes it possible to choose the operating temperature at which crystallization in the form of monocrystals of a ternary or quaternary compound is to take place and it makes it possible to prepare the initial solvent zone at the minimum possible temperature.

This preparation process is advantageously applied to the crystallization of ternary compounds of formula $Cd_xHg_{0.5-x}Te_{0.5}$ and quaternary compounds of formula $Cd_xHg_{0.5-x}Te_ySe_{0.5-y}$, formulas in which x and y are numbers between 0 and 0.5.

In this special case, the initial solvent zone is preferably a tellurium-rich zone containing tellurium and mercury. This solvent zone can be obtained by melting and dissolving Te and HgTe in appropriate quantities.

BRIEF DESCRIPTION OF THE DRAWINGS

The invention is described in greater detail hereinafter relative to non-limitative embodiments and the attached drawings, wherein show.

DETAILED DESCRIPTION OF THE INVENTION

In the processes for producing ternary or quaternary semiconductor compounds in the form of monocrystals using the solvent zone transfer method, the monocrystal growth procedure is established when the solvent zone is in thermodynamic equilibrium with the source compound and the monocrystalline compound formed. The solvent zone is then a ternary or quaternary liquid of Cd, Hg and Te or Cd, Hg, Te and Se, depending on whether the compound is a ternary or quaternary compound of these same constituents.

For simplification purposes, the following description refers to the formation of monocrystals of $Cd_xHg_{0.5-x}Te_{0.5}$ with $0 < x < 0.5$. Obviously the process according to the invention is applicable to any composition of ternary or quaternary compounds of types $Cd_xHg_{0.5-x}Te_{0.5}$ or $Cd_xHg_{0.5-x}Te_ySe_{0.5-y}$.

Figure 2:
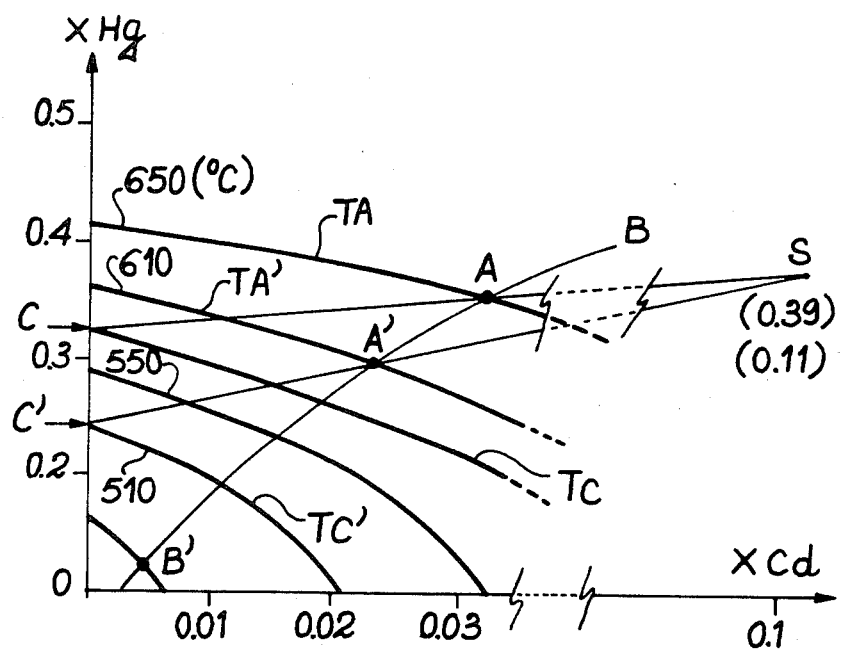
FIG. 2, the phase equilibrium diagram of ternary compounds of formula $Cd_xHg_{0.5-x}Te_{0.5}$, the abscissa values relating to the cadmium concentration of said compounds and the ordinate values to the mercury concentration.

FIG. 2 is the phase equilibrium diagram of compounds of formula. $Cd_xHg_{0.5-x}Te_{0.5}$. The abscissa values give the cadmium concentration and the ordinate values the mercury concentration of said compounds. The zero origin of the axes represents pure tellurium. On this diagram are plotted the locations of points where each liquid is in thermodynamic equilibrium with its solid at a given temperature, ie the liquid isotherms 650° C., 610° C. . . . 540° C.

The process according to the invention consists, in the case of a ternary compound of given composition which is to be crystallized in monocrystalline form, of determining the point S representing said compound, said point S having as the abscissa the cadmium concentration of said compound. The compound in question has in this case the formula $Cd_{0.11}Hg_{0.39}Te_{0.5}$.

This is followed by the plotting of the curve BB' which represents, at different temperatures, the location of the compositions of the solvent in thermodynamic equilibrium with the compound represented by point S.

Figure 1:
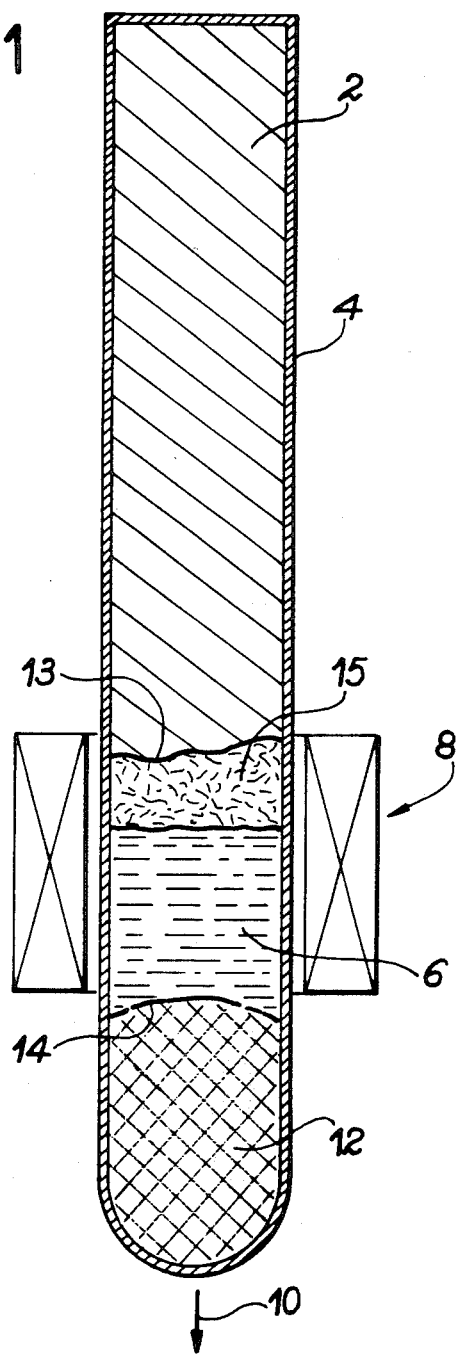
FIG. 1, already described, the crystallization process in monocrystalline form of a compound by solvent zone transfer.

This is followed by the choice of the temperature $T_A$ at which crystallization of the compound in the solvent zone is to take place, e.g. 650° C. This temperature curve intersects curve BB' at a point A, which represents the final composition of the solvent zone. In this case, the final composition corresponds to formula $Cd_{0.03}Hg_{0.35}Te_{0.62}$. On the basis of this composition, crystallization takes place of compound $Cd_{0.11}Hg_{0.39}Te_{0.5}$, as described hereinbefore with reference to FIG. 1.

Finally, the line passing through point A and point S is plotted and constitutes the location of the compositions of the liquid zone dissolving the compound represented by point S on raising the temperature of said zone from temperature Te to temperature $T_A$. This line intersects the axis of the ordinates of the diagram at point C. The latter gives the composition of the initial binary solvent zone, as well as the temperature $T_C$ at which said solvent zone is to be prepared. This temperature $T_C$ is below the chosen operating temperature $T_A$.

In the considered embodiment, the initial solvent zone, which is a tellurium-rich solvent zone, has the composition $Hg_{0.33}Te_{0.67}$ and this composition must be realized at a temperature of 580° C.

For the same compound S, e.g. of formula $Cd_{0.11}Hg_{0.39}Te_{0.5}$, it is possible to choose a temperature other than $T_A$ for carrying out the crystallization of compound S, e.g. a temperature $T_{A'}$ lower than $T_A$. The curve of temperature $T_{A'}$, in this case 610° C., intersects curve BB' at A'. As hereinbefore, the configuration of line A'S constituting the location of the compositions of the liquid zone dissolving the compound represented by point S on raising the temperature of said zone to temperature $T_{A'}$, makes it possible to determine the composition of the binary initial solvent zone as well as the temperature at which the latter has to be prepared. At point C', which is the intersection between line A'S and the ordinate axis of the diagram, the composition of the binary initial solvent zone is approximately $Hg_{0.24}Te_{0.76}$ and the temperature at which the latter is to be prepared is 510° C. This temperature $T_{C'}$ is lower than the chosen operating temperature $T_{A'}$ of the thermodynamic system. Thus, the process permits a crystallization temperature choice.

Following the determination of the composition of the initial solvent zone, the latter can be realized in the case of ternary compounds of formula $Cd_xHg_{0.5-x}Te_{0.5}$ by melting and dissolving Te and HgTe, e.g. in appropriate quantities. The same applies regarding quaternary compounds of formula $Cd_xHg_{0.5-x}Te_ySe_{0.5-y}$. The melting of the initial solvent zone can be carried out rapidly with the aid of a simple heating means.

As the preparation temperature of the binary initial solvent zone is relatively moderate, e.g. 580° C., when it is wished to obtain a crystallization of the compound at temperature $T_A$ at 650° C., or 510° C. when it is wished to carry out the crystallization of the compound at a temperature $T_{A'}$ of 610° C., it is possible to avoid above the liquid, i.e. the initial solvent zone during the preparation thereof, the establishment of a high mercury vapour pressure, which makes it possible to obtain the initial solvent zone under a weak neutral or reducing gas pressure, e.g. at atmospheric pressure.

Figure 3:
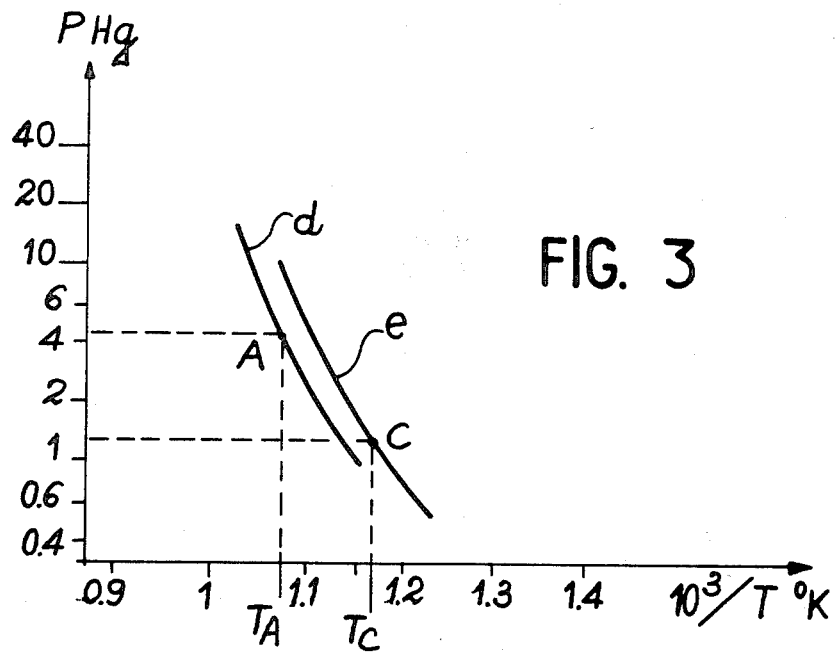
FIG. 3, a graph giving the mercury vapour pressure $P_{Hg}$ in atmosphere as a function of the temperature T expressed in degrees $K^{-1}$ above the binary or ternary liquid zones.

FIG. 3 shows a graph giving the mercury vapour pressure as a function of the temperature, above liquid solvent zones.

Curve D represents the mercury vapour pressure in equilibrium with the solvent zone having the composition defined by BB' of FIG. 2 at the melting temperature of said zone (temperature $T_A$ for point A, temperature $T_{A'}$ for point A') and curve E the mercury vapour pressure in equilibrium with the initial solvent zone having the composition defined by the ordinate of the diagram of FIG. 2 at the melting pressure of said zone (temperature $T_C$ for point C, temperature $T_{C'}$ for point C'), only the temperatures and pressures of points A and C being shown in FIG. 3.

It can be seen that, on the basis of these curves, the mercury vapour pressure is not very high, when the initial solvent zone is formed in accordance with the invention. Thus, said vapour pressure is only 1.4 atmospheres at temperature $T_C$(580° C.) for an initial solvent zone having the composition C (curve E), but it is 4 atmospheres at temperature $T_A$ (650° C.) for an initial solvent zone having the composition A (curve D), like that used in the prior art process.

In an embodiment of the invention, crystallization in the form of a monocrystal took place of a compound of formula $Cd_{0.11}Hg_{0.39}Te_{0.5}$ obtained in known manner, like that described in the aforementioned prior art using an initial solvent zone of composition $Hg_{0.33}Te_{0.67}$, said composition being represented by point C in FIG. 2. This initial solvent zone was prepared by melting and dissolving respectively 10 g of pure tellurium and 25 g of HgTe at 580° C., determined on the basis of the diagram of FIG. 2 and under a pressure of 1 atmosphere of hydrogen ($1.013 \times 10^5$ Pascals). Mercury pressure in equilibrium with said initial solvent zone is close to 1 atmosphere, as shown at point C in FIG. 3. The temperature of this initial solvent zone is then raised to 650° C., during which it partly dissolves the source solid, zone 15 of FIG. 1, in order to reach the thermodynamic equilibrium composition, point A in FIG. 2. It is then able to crystallize a monocrystal (12, FIG. 1) of the compound referred to suitable for producing infrared photo detectors.

What is claimed is:

1. A process for producing a monocrystal of a ternary semiconductor with the formula $Cd_xHg_{0.5-x}Te_{0.5}$ with $0 < x < 0.5$, having a composition S in cadmium, mercury and tellurium, by recrystallizing a feed polycrystal of said formula at a temperature $T_1$ no more than 650° C. from a ternary liquid zone in thermodynamic equilibrium with said polycrystal, said process comprising the steps of:
   (i) providing said polycrystal;
   (ii) selecting temperature $T_1$ at which said recrystallization will occur;
   (iii) plotting said composition S on a phase diagram of the HgCdTe system plotted for the pseudobinary axes HgTe and CdTe, said phase diagram containing a plurality of isotherms including the isotherm for $T_1$, and an isochrome curve (BB') representing the different compositions of the solvent zones in thermodynamic equilibrium with said polycrystal;
   (iv) constructing a line from S through the intercept of the isotherm for $T_1$ and said curve (BB'), said line intercepting the HgTe axis of said phase diagram;
   (v) establishing an initial binary solvent having the composition of Hg and Te determined by the intercept of step (iv);
   (vi) heating said initial binary solvent to said temperature $T_1$;
   (vii) dissolving said polycrystal in said heated initial binary solvent until said ternary liquid zone is obtained; and
   (viii) displacing said ternary liquid zone at $T_1$ along said polycrystal in order to transform said polycrystal into said monocrystal.

2. The process according to claim 1, wherein said ternary compound has the formula $Cd_xHg_{0.5-x}Te_{0.5}$ in which x is a number between 0 and 0.5 and wherein said initial binary solvent zone is a tellurium-rich zone containing tellurium and mercury.

3. The process according to claim 1, wherein said initial binary solvent zone is formed by melting and dissolving Te and HgTe.

4. A process for producing a monocrystal of a quaternary semiconductor with the formula $Cd_xHg_{0.5-x}Te_ySe_{0.5-y}$, wherein X and Y are numbers between 0 and 0.5, having a composition S in cadmium, mercury, tellurium and selenium by recrystallizing a feed polycrystal of said formula at a temperature $T_1$ no more than 650° C., from a quaternary liquid zone in thermodynamic equilibrium with said polycrystal, said process comprising the steps of:
   (i) providing said polycrystal;
   (ii) selecting temperature $T_1$ at which said recrystallization will occur;
   (iii) plotting said composition S on a phase diagram of the HgCdTe system plotted for the pseudobinary axes HgTe and CdTe, said phase diagram containing a plurality of isotherms including the isotherm for $T_1$, and an isochrome curve (BB') representing the different compositions of the solvent zones in thermodynamic equilibrium with said polycrystal;
   (iv) constructing a line from S through the intercept of the isotherm for $T_1$ and said curve (BB'), said line intercepting the HgTe axis of said phase diagram;
   (v) establishing an initial binary solvent having the composition of Hg and Te determined by the intercept of step (iv);
   (vi) heating said initial binary solvent to said temperature $T_1$;
   (vii) dissolving said polycrystal in said heated initial binary solvent until said quaternary liquid zone is obtained; and
   (viii) displacing said quaternary liquid zone at $T_1$ along said polycrystal in order to transform said polycrystal into said monocrystal.

5. The process according to claim 4, wherein said quaternary compound has the formula $Cd_xHg_{0.5-x}Te_ySe_{0.5-y}$ in which x and y are numbers between 0 and 0.5 and wherein said initial binary solvent zone is a tellurium rich zone containing tellurium and mercury.

6. The process according to claim 4, wherein said initial binary solvent zone is formed by melting and dissolving Te and HgTe.

* * * * *

UNITED STATES PATENT AND TRADEMARK OFFICE
CERTIFICATE OF CORRECTION

PATENT NO. : 4,728,388
DATED : Mar. 1, 1988
INVENTOR(S) : Alain Fillot, et al.

It is certified that error appears in the above-identified patent and that said Letters Patent is hereby corrected as shown below:

On the Title Page, Item [30]

The Foreign Application Priority Data should be deleted. No Priority is claimed.

Signed and Sealed this

Twelfth Day of July, 1988

Attest:

DONALD J. QUIGG

*Attesting Officer*   *Commissioner of Patents and Trademarks*